US006879090B2

(12) United States Patent
Roux et al.

(10) Patent No.: US 6,879,090 B2
(45) Date of Patent: Apr. 12, 2005

(54) ACOUSTIC TRANSDUCER WITH PRESTRESSED RING

(75) Inventors: Gérard Roux, Opio (FR); Gilles Lubrano, Mougins (FR); Vito Suppa, Roquefort les Pins (FR)

(73) Assignee: Thales, Paris (FR)

( * ) Notice: Subject to any disclaimer, the term of this patent is extended or adjusted under 35 U.S.C. 154(b) by 0 days.

(21) Appl. No.: 10/481,429

(22) PCT Filed: Jun. 4, 2002

(86) PCT No.: PCT/FR02/01898

§ 371 (c)(1), (2), (4) Date: Aug. 23, 2004

(87) PCT Pub. No.: WO03/002271

PCT Pub. Date: Jan. 9, 2003

(65) Prior Publication Data

US 2004/0256962 A1 Dec. 23, 2004

(30) Foreign Application Priority Data

Jun. 29, 2001 (FR) ........................................... 01 08675

(51) Int. Cl.[7] ............................................... H01L 41/08
(52) U.S. Cl. ....................................... 310/334; 337/369
(58) Field of Search ................................ 310/328, 334, 310/337, 369

(56) References Cited

U.S. PATENT DOCUMENTS 2,469,441 A 5/1949 Pitisci
3,142,035 A * 7/1964 Harris ........................ 367/155
4,446,544 A * 5/1984 Connolly, Jr. ............... 367/155
4,858,206 A * 8/1989 McMahon .................. 367/163
5,739,625 A * 4/1998 Falcus ........................ 310/328
6,222,306 B1 * 4/2001 Groult et al. ............... 310/337

FOREIGN PATENT DOCUMENTS

EP 0 593 323 A 4/1994
FR 2 728 755 A 6/1996

* cited by examiner

*Primary Examiner*—Mark Budd
(74) *Attorney, Agent, or Firm*—Lowe Hauptman Gilman & Berner, LLP

(57) ABSTRACT

The invention relates to acoustic transducers which comprise a ceramic ring formed from a pre-stressed set of segments.

Figure 1:
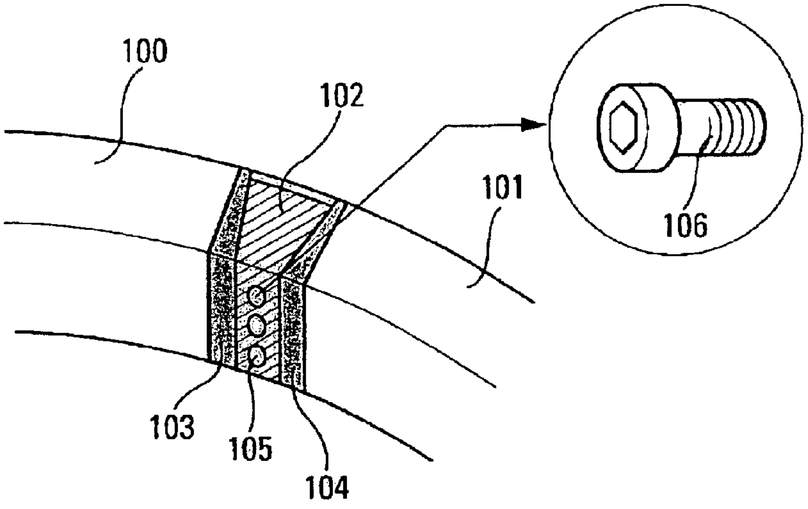

It consists in using, as screws for tightening pre-stressing wedges, screws with hexagonal heads and in placing on the inner face of these wedges a plate provided with recesses in which the cants of these screw heads become anchored. This plate comprises transverse channels allowing the passage of the power supply wires for the sectors. The central screw is removed after the desired pre-stressing has been obtained.

It makes it possible to improve the manufacture of these transducers.

11 Claims, 1 Drawing Sheet

ACOUSTIC TRANSDUCER WITH PRESTRESSED RING

The present invention relates to acoustic transducers which comprise a ceramic ring formed from a pre-stressed set of segments. These transducers in particular make it possible to transmit low frequency acoustic signals at high power. They are principally used in the field of submarine acoustic marking.

From the French patent N° 94 15587, lodged on 23 Dec. 1994 under this same number and published on 28 Jun. 1996 with the reference number 2 728 755 and granted on 24 Jan. 1997, it is known to manufacture a ring type acoustic transducer using a set of piezoelectric segments pre-stressed by means of a set of tightening wedges whose positions can be adjusted by means of screws. This adjustment makes it possible to obtain the desired pre-stressing by tightening the screws to a greater or lesser degree. The value of this pre-stressing is measured by strain gauges which allows the best possible adjustment of this value. The text and figures of the patent in question can be referred to for more details.

This device functions very well but nevertheless has some disadvantages.

Firstly, although the screws do not move in static conditions, they exhibit a certain tendency to unscrew under the effect of vibrations when the transducer is functioning.

Furthermore, various parts, including the wedges and packing pieces and therefore the screws, are raised to a high value alternating electrical potential, typically 15,000 volts. This can give rise to short-circuits between the heads of the screws, which are made from a conductive material such as steel, and the surrounding components which are connected to electrical potentials that are entirely different from that of these parts.

Finally, the electrical power supply wires of the ceramic piezoelectric segments are disposed in front of and between the heads of these screws. In the event of deterioration of the cover of these wires, it is therefore possible to obtain disturbing and dangerous short-circuits.

In order to overcome these disadvantages, the invention proposes a pre-stressed ring acoustic transducer of the type comprising a set of sectors separated by pre-stressing wedges provided with screws making it possible to cause the wedges to slide radially between the sectors in order to ensure the said pre-stressing, principally characterized in that these screws have hexagonal heads and in that it furthermore comprises a flat part positioned on the face of the wedge from which the heads of the screws protrude and comprising recesses whose diameter "d'" is slightly less than the width "d" between the cants of the screw heads so that, during the positioning of this plate, the said screw heads become lodged in these recesses and so that the cants of these heads become anchored against the perimeter of the recess in order to lock the screws in the rotational sense.

According to another characteristic, the said plate comprises an upper flange and a lower flange giving it a U-shape so that it can be clipped on the wedge upon which it is fitted.

According to another characteristic, the plate comprises transverse channels hollowed out within its thickness and designed to allow the passage of the power supply wires for the piezoelectric sectors.

According to another characteristic, the transducer comprises only the two end tightening screws; the median screw having been removed after obtaining the pre-stressing.

According to another characteristic, the said plate (107) is made from insulating material.

Figure 2:
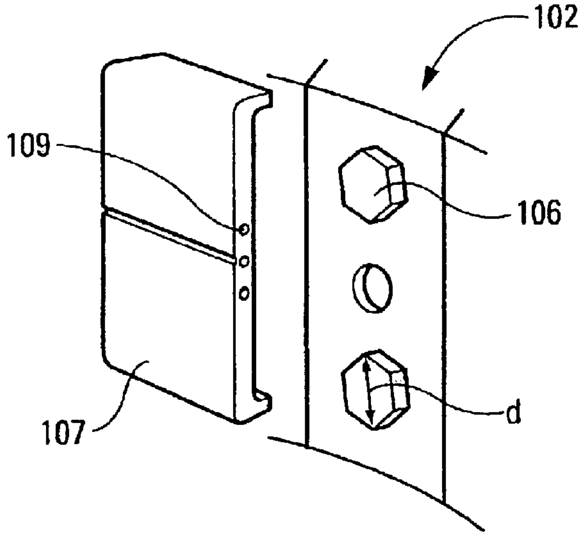
Figure 3:
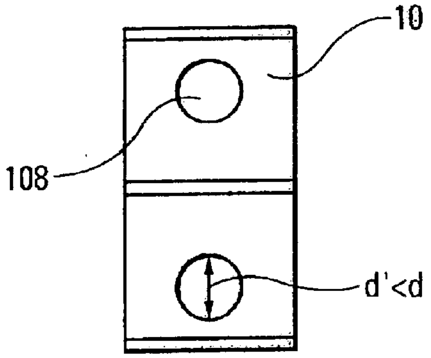

Other features and advantages of the invention will appear clearly in the following description, given by way of non-limiting example with reference to the appended figures which show:

in FIG. 1, a partial view of a transducer element according to the prior art, in FIG. 2, a partial view of characteristic elements of a transducer according to the invention, and in FIG. 3, a detail of one of the elements shown in FIG. 2.

As shown in FIG. 1, a ring transducer such as described in the patent application quoted above comprises piezoelectric sectors such as 100, 101, separated by wedges such as 102 and by packing pieces such as 103 and 104.

Three radial holes 105, drilled in the wedges, make it possible to insert screws 106, one of which is shown in the corner of the drawing enlarged with respect to the hole in which it is placed. On screwing these screws, they come to bear on a shaping ring (not shown) in which the assembly is placed. Under this effect, the wedge moves towards the centre of the ring and compresses the segments.

In the prior art thus described, the screws have round heads, with a hexagonal pit in the centre allowing them to be screwed using a so-called "ALLEN" key.

It is these screws that are subject to becoming unscrewed under the effect of vibrations and of causing short-circuits.

According to the invention, as shown in FIG. 2, instead of these screws, screws with hexagonal heads are used, which can therefore be screwed using a pipe-wrench, or a fork-wrench or even a wrench having a socket fitted on a ratchet. In order to prevent the unscrewing of these screws, the invention then proposes placing on the inner face of the wedge 102, from which the hexagonal heads of the screws 106 protrude, a plate 107 whose width and height are substantially equal to those of the inner face of the wedge 102. This plate is advantageously terminated by upper and lower flanges which make it possible to fit it onto the inner face of the wedge and which give it a U-shape.

On the inner face of this plate facing the inner face of the wedge, there have been formed two recesses 108 whose diameter d' is slightly less than the distance d between the opposite cants of the heads of the screws 106. In this way, when the plate 107 is placed in position, the heads of the screws are forced to lodge in the recesses and the cants of these heads "bite" into the circumference of the recesses 108, which on the one hand completes the holding in place of the plate 107 and, on the other hand, prevents the subsequent unscrewing of the screws under the effect of vibrations by anchoring the heads in the recesses. In the example shown in FIGS. 2 and 3, the central screw has been unscrewed and removed after having adjusted the pre-stressing to the desired value in order to form, substantially in the centre of this plate 107, transverse channels 109, which allow the passage of the wires necessary for the power supply of the piezoelectric segments. In this example, three channels have been shown allowing the hot spot, cold spot and earth wires to be passed through.

Therefore, the part 107 according to the invention simultaneously makes it possible to lock the screws 106 in order to prevent them from unscrewing with vibrations, to hold the electrical power supply wires for the sectors and to insulate them from their environment from the electrical point of view.

What is claimed is:

1. Pre-stressed ring acoustic transducer of the type comprising a set of sectors separated by pre-stressing wedges provided with screws making it possible to cause the wedges to slide radially between the sectors in order to ensure the said pre-stressing, wherein characterized in that these screws have hexagonal heads and in that it furthermore comprises a flat part positioned on the face of the wedge from which the heads of the screws protrude and comprising recesses whose diameter “d'” is slightly less than the width “d” between the cants of the screw heads so that, during the positioning of this plate, the said screw heads become lodged in these recesses and so that the cants of these heads become anchored against the perimeter of the recess in order to lock the screws in the rotational sense.

2. Transducer according to claim 1, wherein the said plate comprises an upper flange and a lower flange giving it a U-shape so that it can be clipped on the wedge upon which it is fitted.

3. Transducer according to claim 1, wherein the plate comprises transverse channels hollowed out within its thickness and designed to allow the passage of the power supply wires for the piezoelectric sectors.

4. Transducer according to claim 1, wherein it comprises only the two end tightening screws; the median screw having been removed after obtaining the pre-stressing.

5. Transducer according to claim 1, wherein the said plate is made from insulating material.

6. Transducer according to claim 2, wherein the plate comprises transverse channels hollowed out within its thickness and designed to allow the passage of the power supply wires for the piezoelectric sectors.

7. Transducer according to claim 2, wherein it comprises only the two end tightening screws; the median screw having been removed after obtaining the pre-stressing.

8. Transducer according to claim 3, wherein it comprises only the two end tightening screws; the median screw having been removed after obtaining the pre-stressing.

9. Transducer according to claim 2, wherein the said plate is made from insulating material.

10. Transducer according to claim 3, wherein the said plate is made from insulating material.

11. Transducer according to claim 4, wherein the said plate is made from insulating material.

* * * * *